United States Patent
Song (10) Patent No.: US 10,848,136 B2
(45) Date of Patent: *Nov. 24, 2020

(54) ELECTRONIC DEVICE

(71) Applicant: SK hynix Inc., Gyeonggi-do (KR)

(72) Inventor: Jeong-Eun Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/748,417

(22) Filed: Jan. 21, 2020

(65) Prior Publication Data

US 2020/0162063 A1 May 21, 2020

Related U.S. Application Data

(63) Continuation of application No. 15/612,694, filed on Jun. 2, 2017, now Pat. No. 10,560,078.

(30) Foreign Application Priority Data

Nov. 2, 2016 (KR) .................. 10-2016-0145085

(51) Int. Cl.
*H03K 5/12* (2006.01)
*H03K 3/353* (2006.01)
*H03K 4/90* (2006.01)
*H03K 6/04* (2006.01)

(52) U.S. Cl.
CPC ............ *H03K 5/12* (2013.01); *H03K 3/353* (2013.01); *H03K 4/90* (2013.01); *H03K 6/04* (2013.01)

(58) Field of Classification Search
CPC ................................. H03K 5/12; H03K 3/353
USPC .......................................................... 327/170
See application file for complete search history.

(56) References Cited

U.S. PATENT DOCUMENTS

| 10,560,078 B2 * | 2/2020 | Song | H03K 3/353 |
| 2007/0046802 A1 * | 3/2007 | Ham | H04N 5/3575 |
| | | | 348/308 |

* cited by examiner

*Primary Examiner* — Metasebia T Retebo
(74) *Attorney, Agent, or Firm* — IP & T Group LLP (57) ABSTRACT

Provided is an electronic device including a ramp signal generation circuit configured to generate a ramp signal having a second slope that is greater by a first level than a first slope which corresponds to an analog gain, and a slope correction circuit configured to correct the second slope of the ramp signal by the first level to obtain the first slope.

13 Claims, 4 Drawing Sheets

ELECTRONIC DEVICE

CROSS-REFERENCE TO RELATED APPLICATIONS

This application is a continuation of U.S. patent application Ser. No. 15/612,694 filed on Jun. 2, 2017, which claims benefits of priority of Korean Patent Application No. 10-2016-0145085 filed on Nov. 2, 2016. The disclosure of each of the foregoing application is incorporated herein by reference in its entirety.

BACKGROUND

1. Field

Exemplary embodiments relate to a semiconductor design technology, and more particularly, to an electronic device.

2. Description of the Related Art

An electronic device may include an analog-to-digital converter (ADC) for converting an analog signal to a digital signal.

For example, an image sensing device may include an ADC for converting an analog pixel signal to a digital signal. The ADC may compare the analog pixel signal with a ramp signal and generate the digital signal based on the result of the comparison. The ramp signal is a comparison signal for determining the voltage level of the pixel signal and its voltage level per unit time is adjusted to be constant in a prescribed range.

The image sensing device may adjust an analog gain by adjusting a slope of the ramp signal. The analog gain is a parameter related to peripheral illumination conditions.

An image sensing device captures images using photosensitive properties of semiconductors. The image sensing device is typically classified into a charge-coupled device (CCD) image sensor or a complementary metal-oxide semiconductor (CMOS) image sensor. A CMOS image sensor allows for both analog and digital control circuits to be directly implemented on a single integrated circuit (IC) making the CMOS image sensor the most widely used type of image sensor.

SUMMARY

Various embodiments are directed to an electronic device capable of substantially maintaining the linearity of an analog gain to be constant when a slope of a ramp signal is adjusted according to the analog gain.

In an accordance with an embodiment, an electronic device may include: a ramp signal generation circuit configured to generate a ramp signal having a second slope that is greater by a first level than a first slope which corresponds to an analog gain; and a slope correction circuit configured to correct the second slope of the ramp signal by the first level to obtain the first slope.

The slope correction circuit optionally may correct the slope of the ramp signal by a second level.

The ramp signal generation circuit may adjust the slope of the ramp signal on a basis of a variable resistance.

The ramp signal generation circuit may adjust the slope of the ramp signal on a basis of a variable current.

The first level and the second level may be equal to each other and are different from each other.

In an accordance with another embodiment, an electronic device may include: a ramp signal generation block configured to generate a ramp signal on a basis of a ramp code signal; a slope adjustment block configured to adjust a slope of the ramp signal such that the ramp signal has a second slope more than a first slope corresponding to an analog gain, on a basis of a gain code signal, the second slope corresponding to adjusting the first slope by the first level; a first slope correction block configured to basically correct the slope of the ramp signal by the first level on a basis of a first correction code signal; and a second slope correction block configured to secondarily correct the slope of the ramp signal by a second level on a basis of a second correction code signal.

The first slope correction block secondarily may increase the slope of the ramp signal in a range corresponding to the first level.

The first slope correction block may include at least one first resistor part electrically coupled in parallel to an output terminal of the ramp signal, and the first resistor part selectively reflects a first resistance value corresponding to the first level in the output terminal on the basis of the first correction code signal.

The first resistor part basically may reflect the first resistance value in the output terminal and secondarily reflects the first resistance value in the output terminal optionally.

The second slope correction block may include at least one second resistor part electrically coupled in parallel to an output terminal of the ramp signal, and the second resistor part reflects a second resistance value corresponding to the second level in the output terminal on the basis of the second correction code signal.

The second resistor part basically may reflect the second resistance value in the output terminal and secondarily reflects the second resistance value in the output terminal optionally.

The slope adjustment block may include a plurality of third resistor parts electrically coupled in parallel to an output terminal of the ramp signal, and the plurality of third resistor parts reflect a third resistance value corresponding to the second slope in the output terminal on the basis of the gain code signal.

The ramp signal generation block may include: a bias signal generation unit configured to generate a bias signal having a fixed voltage level corresponding to a reference current; and a ramp current generation unit configured to supply a ramp current, which is adjusted by a prescribed level per unit time, to an output terminal of the ramp signal on a basis of the bias signal and the ramp code signal.

In an accordance with further another embodiment, an electronic device may include: a ramp signal generation block configured to generate a ramp signal on a basis of a ramp code signal and to adjust a slope of the ramp signal on a basis of a bias signal; a bias signal generation block configured to generate the bias signal having a second voltage level higher than a first voltage level corresponding to an analog gain, on a basis of a gain code signal, the second voltage level corresponding to adjusting the first voltage level by the first level; a first bias signal correction block configured to basically correct the voltage level of the bias signal by the first level on a basis of a first correction code signal; and a second bias signal correction block configured to secondarily correct the voltage level of the bias signal by a second level on a basis of a second correction code signal.

The first bias signal correction block secondarily may lower the voltage level of the bias signal in a range corresponding to the first level.

The first bias signal correction block may include at least one first correction current generation unit electrically coupled in parallel to an output terminal of the bias signal, and the first correction current generation unit selectively may supply a first correction current corresponding to the first level to the output terminal on the basis of the first correction code signal.

The first correction current generation unit basically may supply the first correction current to the output terminal and secondarily supplies the first correction current to the output terminal optionally.

The second bias signal correction block may include at least one second correction current generation unit electrically coupled in parallel to an output terminal of the bias signal, and the second correction current generation unit supplies a second correction current corresponding to the second level to the output terminal on the basis of the second correction code signal.

The second correction current generation unit basically may supply the second correction current to the output terminal and secondarily supplies the second correction current to the output terminal optionally.

The bias signal generation block may include a plurality of bias current generation units electrically coupled in parallel to an output terminal of the bias signal, and the plurality of bias current generation units supply a bias current corresponding to the second voltage level to the output terminal on the basis of the gain code signal.

The ramp signal generation block may include: a ramp current generation unit configured to supply a ramp current, which is adjusted by a prescribed unit current amount per unit time, to an output terminal of the ramp signal, on the basis of the ramp code signal, and to adjust the unit current amount on a basis of the bias signal; and a fixed resistor unit configured to convert the ramp current into the ramp signal.

In an accordance with further another embodiment, a method for driving an electronic device may include: intentionally generating a ramp signal having a second slope increased or decreased more than a first slope corresponding to an analog gain; basically correcting the ramp signal to have the first slope; and secondarily correcting the ramp signal to have the first slope when the ramp signal has a third slope increased or decreased more than the first slope.

In accordance with the embodiments of the present embodiments, when a slope of a ramp signal corresponding to an analog gain is adjusted, it is possible to substantially maintain the linearity of the analog gain to be constant, so that it is possible to improve the operational reliability of an electronic device.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The terminology used herein is for the purpose of describing particular embodiments only and is not intended to be limiting of the inventive concept. As used herein, singular forms are intended to include the plural forms as well, unless the context clearly indicates otherwise. It will be further understood that the terms "comprises," "comprising," "includes," and/or "including" when used in this specification, indicate the presence of stated features, but do not preclude the presence or addition of one or more other features. As used herein, the term "and/or" indicates any and all combinations of one or more of the associated listed items.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It is noted that the drawings are simplified schematics and as such are not necessarily drawn to scale. In some instances, various parts of the drawings may have been exaggerated in order to more dearly illustrate certain features of the illustrated embodiments.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Figure 1:
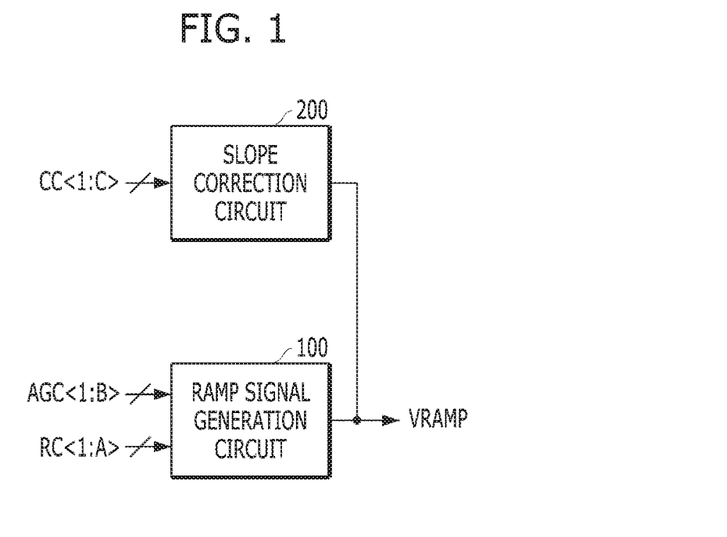
FIG. 1 is a block diagram illustrating an electronic device in accordance with a first embodiment of the present invention.

FIG. 1 is a block diagram illustrating an electronic device in accordance with a first embodiment of the present invention.

Referring to FIG. 1, the electronic device may include a ramp signal generation circuit 100 and a slope correction circuit 200.

The ramp signal generation circuit 100 may generate a ramp signal VRAMP on the basis of a ramp code signal RC<1:A> and a gain code signal AGC<1:B>. The ramp signal VRAMP may have a second slope that is greater than a first slope corresponding to an analog gain. The second slope may be obtained by adjusting the first slope by a first level. The ramp signal generation circuit 100 may generate the ramp signal VRAMP having the second slope. For example, the ramp signal generation circuit 100 may generate the ramp signal VRAMP having the second slope by increasing by a first level the first slope. In an embodiment, the ramp signal generation circuit 100 may adjust the slope of the ramp signal VRAMP to attain the second slope by employing a variable resistance.

On the basis of a correction code signal CC<1:C>, the slope correction circuit 200 may correct the slope of the ramp signal VRAMP by the first level. The slope correction circuit 200 may also perform a second correction of the slope of the ramp signal VRAMP by a second level. The second correction may be optional. In some embodiments, the first level and the second level may be substantially equal to each other. Alternatively, the first level and the second level may be different from each other.

Figure 2:
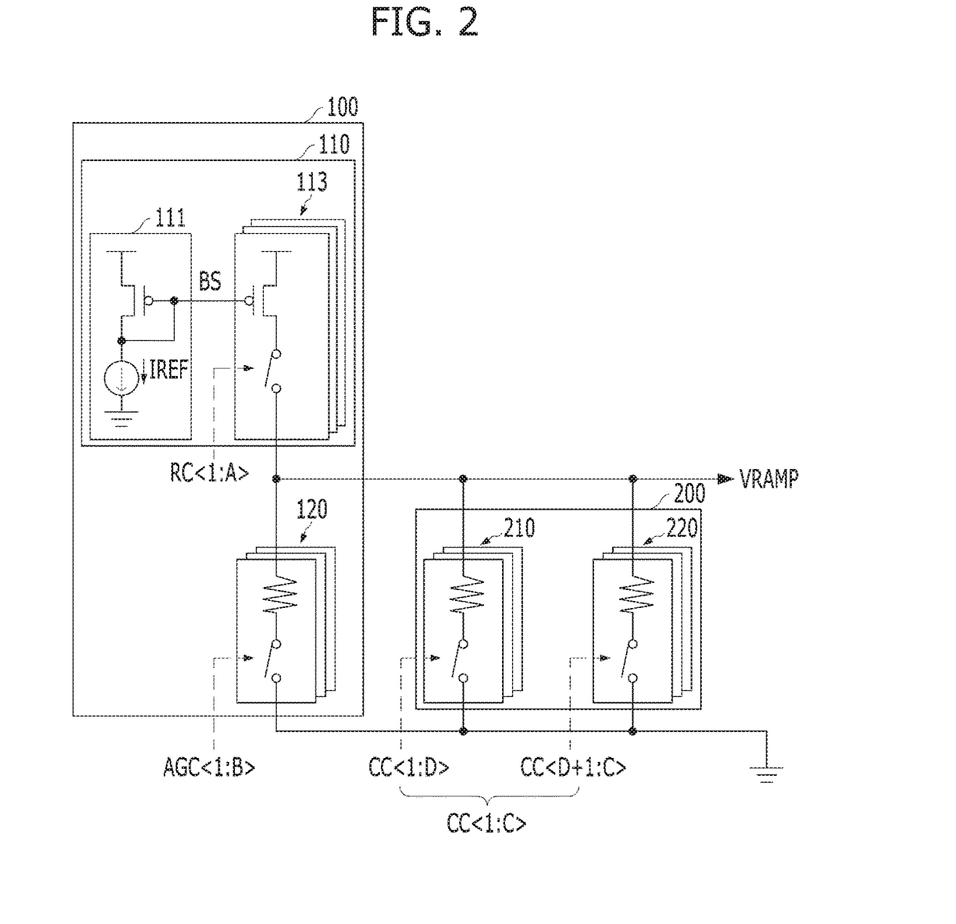
FIG. 2 is a diagram illustrating a ramp signal generation circuit and a slope correction circuit illustrated in FIG. 1.

FIG. 2 illustrates a diagram illustrating an exemplary configuration of the ramp signal generation circuit 100 and the slope correction circuit 200 illustrated in FIG. 1.

Referring to FIG. 2, the ramp signal generation circuit 100 may include a ramp signal generation block 110 and a slope adjustment block 120.

The ramp signal generation block 110 may generate the ramp signal VRAMP which is ramped in a prescribed range, on the basis of the ramp code signal RC<1:A>. For example, the ramp signal generation block 110 may include a bias signal generation unit 111 and a ramp current generation unit 113.

The bias signal generation unit 111 may generate a bias signal BS having a predetermined voltage level corresponding to a reference current IREF.

The ramp current generation unit 113 may supply a ramp current, which is adjusted by a prescribed level per unit time, to an output terminal of the ramp signal VRAMP on the basis of the bias signal BS and the ramp code signal RC<1:A>. For example, the ramp current generation unit 113 may include first to $A^{th}$ current mirrors electrically coupled in parallel to one another between a power supply voltage terminal and the output terminal (where "A" is a natural number equal to or more than 2). The first to $A^{th}$ current mirrors may be sequentially selected on the basis of first to $A^{th}$ ramp control signals included in the ramp code signal RC<1:A>, and may generate a mirroring current corresponding to the reference current IREF as a ramp current on the basis of the bias signal BS.

The slope adjustment block 120 may adjust the slope of the ramp signal VRAMP on the basis of the gain code signal AGC<1:B>. Particularly, the slope adjustment block 120 may adjust the slope of the ramp signal VRAMP such that the ramp signal VRAMP has the second slope which is greater by the first level than the first slope. For example, the slope adjustment block 120 may include first to $B^{th}$ slope adjustment resistor parts electrically coupled in parallel to one another between the output terminal and a ground voltage terminal (where "B" is a natural number equal to or more than 2). At least one of the first to $B^{th}$ slope adjustment resistor parts may be selected on the basis of first to $B^{th}$ gain control signals included in the gain code signal AGC<1:B> driving corresponding switches, and the first to $B^{th}$ slope adjustment resistor parts may reflect a first resistance value corresponding to the second slope in the output terminal. The resistors included in the first to $B^{th}$ slope adjustment resistor parts may have resistance values substantially equal to one another or different from one another.

The slope correction circuit 200 may include a first slope correction block 210 and a second slope correction block 220.

On the basis of at least one (hereinafter, referred to as a "first correction code signal CC<1:D>") of first and $C^{th}$ correction control signals included in the correction code signal CC<1:C>, the first slope correction block 210 may basically increase the slope of the ramp signal VRAMP by the first level (where "C" is a natural number equal to or more than 2 and "D" is a natural number equal to or more than 1), and may secondarily decrease the slope of the ramp signal VRAMP in a range corresponding to the first level. For example, the first slope correction block 210 may include first to $D^{th}$ slope correction resistor parts electrically coupled in parallel to one another between the output terminal and the ground voltage terminal. The first to $D^{th}$ slope correction resistor parts may selectively reflect a second resistance value corresponding to the first level in the output terminal on the basis of the first correction code signal CC<1:D>. For example, the first to $D^{th}$ slope correction resistor parts may primarily reflect the second resistance value in the output terminal and may secondarily reflect the second resistance value in the output terminal optionally.

On the basis of the remaining signal (hereinafter, referred to as a "second correction code signal CC<D+1:C>") of the first and $C^{th}$ correction control signals included in the correction code signal CC<1:C>, the second slope correction block 220 may secondarily decrease the slope of the ramp signal VRAMP by the second level. For example, the second slope correction block 220 may include $(D+1)^{th}$ to $C^{th}$ slope correction resistor parts electrically coupled in parallel to the output terminal. The $(D+1)^{th}$ to $C^{th}$ slope correction resistor parts may reflect a third resistance value corresponding to the second level in the output terminal on the basis of the second correction code signal CC<D+1:C>. For example, the $(D+1)^{th}$ to $C^{th}$ slope correction resistor parts may primarily reflect the third resistance value in the output terminal and may secondarily reflect the third resistance value in the output terminal optionally.

Hereinafter, an operation of the electronic device having the above configuration in accordance with the first embodiment will be described.

The following configuration of the first embodiment will be described as an example. For example, the slope adjustment block 120 may include first to fourth slope adjustment resistor parts, the first slope correction block 210 may include a first slope correction resistor part, and the second slope correction 220 may include second to sixth slope correction resistor parts. In such a case, the first to fourth slope adjustment resistor parts may be respectively controlled by first to fourth gain control signals AGC<1:4> included in a gain code signal AGC<1:4>, the first slope correction resistor part may be controlled by a first correction control signal CC<1>, and the second to sixth slope correction resistor parts may be respectively controlled by second to sixth correction control signals CC<2:6>.

An operation in the case of requiring no correction will be described. For example, the case of requiring no correction may include a case in which the first to fourth slope adjustment resistor parts have been ideally designed without any process variation.

The ramp signal generation circuit 100 may generate the ramp signal VRAMP on the basis of the ramp code signal RC<1:A>. For example, on the basis of the gain code signal AGC<1:4>, the ramp signal generation circuit 100 may intentionally generate the ramp signal VRAMP having the second slope decreased by the first level more than the first slope corresponding to the analog gain.

The slope correction circuit 200 may primarily correct the slope of the ramp signal VRAMP such that the ramp signal VRAMP has the first slope increased by the first level more than the second slope. For example, the first slope correction resistor part (or a first correction means) included in the slope correction circuit 200 is activated (or enabled) on the basis of the first correction code signal CC<1>, so that the slope of the ramp signal VRAMP may increase. In this case, the second to sixth correction code signals CC<2:6> may be inactivated (or disabled).

For example, in the case of requiring no correction, control signals according to the analog gain may be generated as indicated in Table 1 below.

TABLE 1

| Analog Gain | AGC <1> | AGC <2> | AGC <3> | AGC <4> | CC <1> | CC <2> | CC <3> | CC <4> | CC <5> | CC <6> |
|---|---|---|---|---|---|---|---|---|---|---|
| 1 | 1 | 0 | 0 | 0 | 1 | 0 | 0 | 0 | 0 | 0 |
| 2 | 1 | 1 | 0 | 0 | 1 | 0 | 0 | 0 | 0 | 0 |
| 4 | 1 | 1 | 1 | 0 | 1 | 0 | 0 | 0 | 0 | 0 |
| 8 | 1 | 1 | 1 | 1 | 1 | 0 | 0 | 0 | 0 | 0 |

In Table 1 above, "1" may represent that a corresponding control signal is activated and "0" may represent that a corresponding control signal is inactivated.

Next, the case of requiring correction will be described. For example, the case of requiring correction may include a case in which the first to fourth slope adjustment resistor parts have been non-ideally designed due to a process variation. Hereinafter, two examples will be described.

In the first example, the case in which a resistance value of the first slope adjustment resistor part has decreased due to a process variation will be described.

The ramp signal generation circuit 100 may generate the ramp signal VRAMP on the basis of the ramp code signal RC<1:A>. In this case, the ramp signal generation circuit 100 should intentionally generate the ramp signal VRAMP having the second slope instead of the first slope on the basis of the gain code signal AGC<1:4>, but the ramp signal generation circuit 100 may generate the ramp signal VRAMP having a third slope due to a process variation. The third slope may be less than the second slope.

The slope correction circuit 200 may perform a first increase of the slope of the ramp signal VRAMP by the first level on the basis of the first correction code signal CC<1>. For example, the first slope correction resistor part is enabled on the basis of the first correction code signal CC<1>, so that the slope of the ramp signal VRAMP may increase. However, since the slope of the ramp signal VRAMP has decreased due to a process variation, the slope correction circuit 200 needs to be further adjusted by performing a second increase of the slope of the ramp signal VRAMP on the basis of the first correction code signal CC<1> and the second to sixth correction code signals CC<2:6>. For example, the first slope correction resistor part is disabled on the basis of the first correction code signal CC<1>, so that the ramp signal VRAMP may be corrected to have the first slope.

For example, in the case of requiring correction, control signals according to the analog gain may be generated as indicated in Table 2 below.

TABLE 2

| Analog Gain | AGC <1> | AGC <2> | AGC <3> | AGC <4> | CC <1> | CC <2> | CC <3> | CC <4> | CC <5> | CC <6> |
|---|---|---|---|---|---|---|---|---|---|---|
| 1 | 1 | 0 | 0 | 0 | 0 | 0 | 0 | 0 | 0 | 0 |
| 2 | 1 | 1 | 0 | 0 | 0 | 0 | 0 | 0 | 0 | 0 |
| 4 | 1 | 1 | 1 | 0 | 0 | 0 | 0 | 0 | 0 | 0 |
| 8 | 1 | 1 | 1 | 1 | 0 | 0 | 0 | 0 | 0 | 0 |

In Table 2 above, it can be understood that the first gain code signal AGC<1> activates all analog gains. In such a case, since parallel-coupled resistors (e.g., the first to fourth slope adjustment resistor parts) gradually increase with an increase in the analog gain, the influence of a resistance value reflected by the first slope adjustment resistor part may be gradually reduced. As a consequence, the degree of a decrease in the third slope may be gradually reduced with an increase in the analog gain.

In Table 2 above, the second to sixth correction code signals CC<2:6> are all inactivated, however, is not limited to such an example only.

Figure 3:
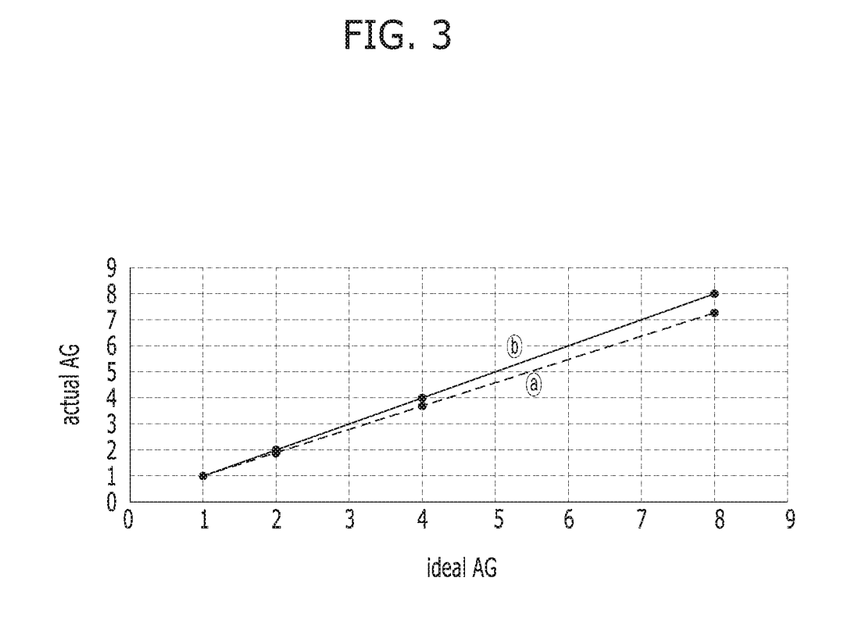
FIGS. 3 to 6 are graphs illustrating performance of an electronic device illustrated in FIG. 1.
Figure 4:
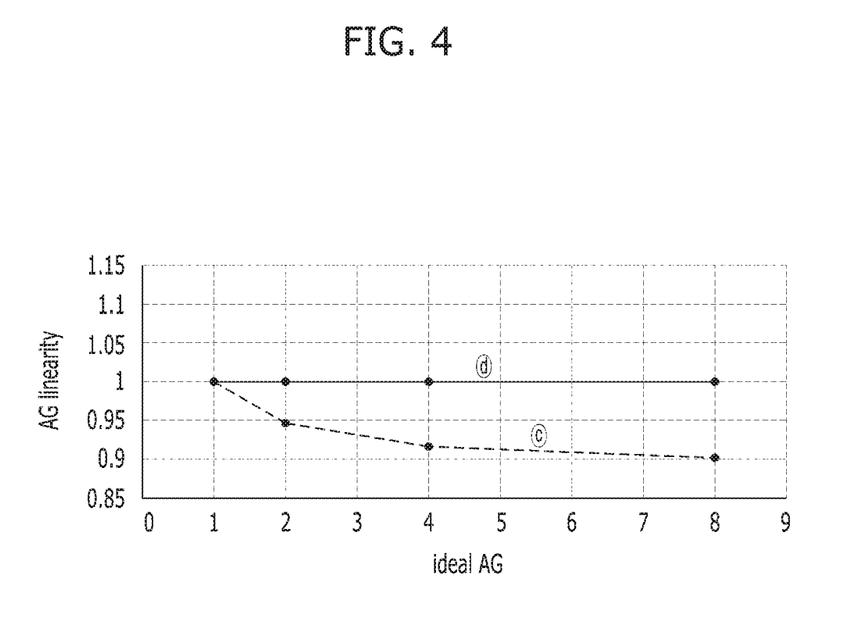

FIGS. 3 and 4 are graphs illustrating improved performance of the electronic device in accordance with the first embodiment of the present invention.

FIG. 3 illustrates a graph showing an actual analog gain (AG) with respect to an ideal analog gain (AG), and FIG. 4 illustrates a graph showing the linearity of an analog gain (AG linearity) with respect to the ideal analog gain (AG).

When the resistance value of the first slope adjustment resistor part has decreased due to any process variation, the slope of the ramp signal VRAMP may decreased, so that the actual analog gain (AG) may be lower than the ideal analog gain (AG) as illustrated in FIG. 3 (ⓐ). As described above, since the degree of a decrease in the third slope may be gradually reduced with an increase in the ideal analog gain (AG), the actual analog gain (AG) may decrease as compared with the ideal analog gain (AG).

Accordingly, when the resistance value of the first slope adjustment resistor part has unexpectedly decreased, the first slope adjustment resistor part is allowed to be disabled, so that the slope of the ramp signal VRAMP may be increased and thus the actual analog gain (AG) may be upward to an approximate value of the ideal analog gain (AG) (ⓑ). The actual analog gain (AG) may be defined by Equation 1 below.

$$\text{actual } AG = \{R_{AG=1}/R_{AG=k}\} = \{S_{AG=1}/S_{AG=k}\} \quad \text{Equation 1}$$

In Equation 1 above, "$R_{AG=k}$" denotes a resistance value reflected in the output terminal of the ramp signal VRAMP when the actual analog gain (AG) is 'k' (where k is 1, 2, 4, or 8), "$R_{AG=1}$" denotes a resistance value reflected in the output terminal of the ramp signal VRAMP when the actual analog gain (AG) is '1', "$S_{AG=k}$" denotes the slope of the ramp signal VRAMP when the actual analog gain (AG) is 'k' (where k is 1, 2, 4, or 8), and "$S_{AG=1}$" denotes the slope of the ramp signal VRAMP when the actual analog gain (AG) is '1'.

When the actual analog gain (AG) is lower than the ideal analog gain (AG) (ⓐ), the linearity of an analog gain (AG linearity) with respect to the ideal analog gain (AG) may be downward as illustrated in FIG. 4 (ⓒ). Furthermore, the actual analog gain (AG) is upward to the approximate value of the ideal analog gain (AG) (ⓑ), so that the linearity of the analog gain (AG linearity) with respect to the ideal analog gain (AG) may be upward to a normal value (ⓓ). The linearity of the analog gain (AG linearity) may be defined by Equation 2 below.

$$AG\ linearity = \{actual\ AG_{AG=k}/actual\ AG_{AG=1}\} \quad \text{Equation 2}$$

In the second example, the case in which the resistance value of the first slope adjustment resistor part has increased due to any process variation will be described.

The ramp signal generation circuit 100 may generate the ramp signal VRAMP on the basis of the ramp code signal RC<1:A>. In this case, the ramp signal generation circuit 100 should intentionally generate the ramp signal VRAMP having the second slope instead of the first slope on the basis of the gain code signal AGC<1:4>, but the ramp signal generation circuit 100 may generate the ramp signal VRAMP having a third slope due to any process variation. The third slope may be more than the second slope.

The slope correction circuit 200 may primarily increase the slope of the ramp signal VRAMP on the basis of the first correction code signal CC<1>, and may secondarily increase the slope of the ramp signal VRAMP on the basis of the second to sixth correction code signals CC<2:6>. For example, the first slope correction resistor part is enabled on the basis of the first correction code signal CC<1> and at least one of the second to sixth slope correction resistor parts (or a second correction means) is enabled on the basis of the second to sixth correction code signals CC<2:6>, so that the ramp signal VRAMP may be corrected to have the first slope.

For example, in the case of requiring the aforementioned correction, control signals according to the analog gain may be generated as indicated in Table 3 below.

TABLE 3

| Analog Gain | AGC <1> | AGC <2> | AGC <3> | AGC <4> | CC <1> | CC <2> | CC <3> | CC <4> | CC <5> | CC <6> |
|---|---|---|---|---|---|---|---|---|---|---|
| 1 | 1 | 0 | 0 | 0 | 1 | 1 | 0 | 0 | 0 | 0 |
| 2 | 1 | 1 | 0 | 0 | 1 | 1 | 0 | 0 | 0 | 0 |
| 4 | 1 | 1 | 1 | 0 | 1 | 1 | 0 | 0 | 0 | 0 |
| 8 | 1 | 1 | 1 | 1 | 1 | 1 | 0 | 0 | 0 | 0 |

In Table 3 above, it can be understood that the first gain code signal AGC<1> activates all analog gains. In such a case, since parallel-coupled resistors (e.g., the first to fourth slope adjustment resistor parts) gradually increase with an increase in the analog gain, the influence of a resistance value reflected by the first slope adjustment resistor part may be gradually reduced. As a consequence, the degree of an increase in the third slope may be gradually reduced with an increase in the analog gain.

In Table 3 above, only some of the second to sixth correction code signals CC<2:6> are activated as an example, however, it is noted that the invention is not limited in this way.

Figure 5:
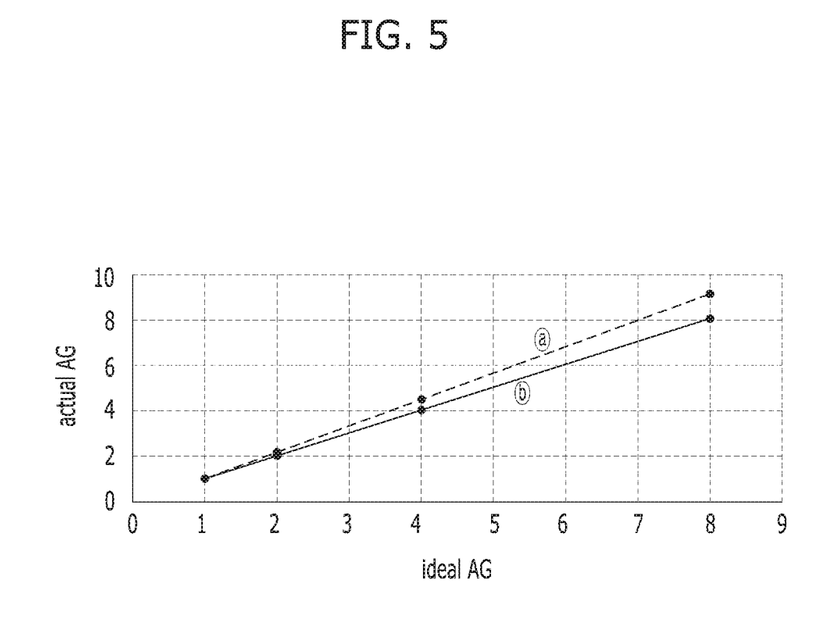
Figure 6:
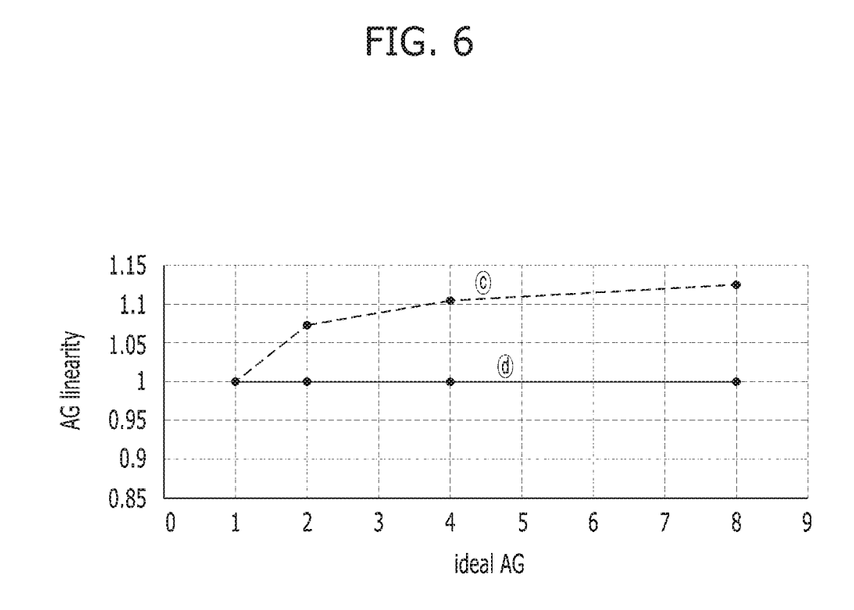

FIG. 5 and FIG. 6 illustrate graphs illustrating improved performance of the electronic device in accordance with the first embodiment of the present invention.

FIG. 5 illustrates a graph showing the actual analog gain (AG) with respect to the ideal analog gain (AG), and FIG. 6 illustrates a graph showing the linearity of an analog gain (AG linearity) with respect to the ideal analog gain (AG).

When the resistance value of the first slope adjustment resistor part has increased due to any process variation, the slope of the ramp signal VRAMP may increase, so that the actual analog gain (AG) may be upper than the ideal analog gain (AG) as illustrated in FIG. 5 (ⓐ). As described above, since the degree of an increase in the third slope may be gradually reduced with an increase in the ideal analog gain (AG), the actual analog gain (AG) may increase as compared with the ideal analog gain (AG).

Accordingly, when the resistance value of the first slope adjustment resistor part has unexpectedly increased, at least one of the second to sixth slope correction resistor parts is allowed to be enabled, so that the slope of the ramp signal VRAMP may be decreased and thus the actual analog gain (AG) may be downward to the approximate value of the ideal analog gain (AG) (ⓑ).

When the actual analog gain (AG) is upper than the ideal analog gain (AG) (ⓐ), the linearity of the analog gain (AG linearity) with respect to the ideal analog gain (AG) may be upward as illustrated in FIG. 6 (ⓒ). Furthermore, the actual analog gain (AG) is downward to the approximate value of the ideal analog gain (AG) (ⓑ), so that the linearity of the analog gain (AG linearity) with respect to the ideal analog gain (AG) may be downward to a normal value (ⓓ).

Figure 7:
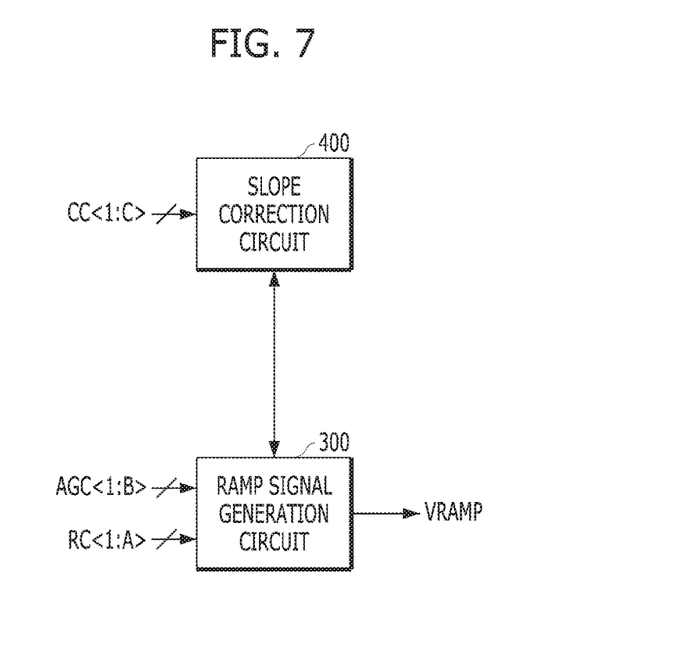
FIG. 7 is a block diagram illustrating an electronic device in accordance with a second embodiment of the present invention.

FIG. 7 is a block diagram illustrating an electronic device in accordance with a second embodiment of the present invention.

Referring to FIG. 7, the electronic device may include a ramp signal generation circuit 300 and a slope correction circuit 400.

The ramp signal generation circuit 300 may generate a ramp signal VRAMP on the basis of a ramp code signal RC<1:A> and a gain code signal AGC<1:B>. The ramp signal VRAMP may have a second slope more than a first slope corresponding to an analog gain, and the second slope corresponds to the result of adjusting the first slope by a first level. The ramp signal generation circuit 300 may generate the ramp signal VRAMP having the second slope instead of the first slope. For example, the ramp signal generation circuit 300 may generate the ramp signal VRAMP having the second slope decreased by the first level more than the first slope. The ramp signal generation circuit 300 may adjust the slope of the ramp signal VRAMP on the basis of a variable current.

On the basis of a correction code signal CC<1:C>, the slope correction circuit 400 may primarily correct the slope of the ramp signal VRAMP by the first level and secondarily correct the slope of the ramp signal VRAMP by a second level. The second correction may be optional. In some embodiments, the first level and the second level may be substantially equal to each other. Alternatively, the first level and the second level may be different from each other. The slope correction circuit 400 may indirectly correct the slope of the ramp signal VRAMP through the ramp signal generation circuit 300.

Figure 8:
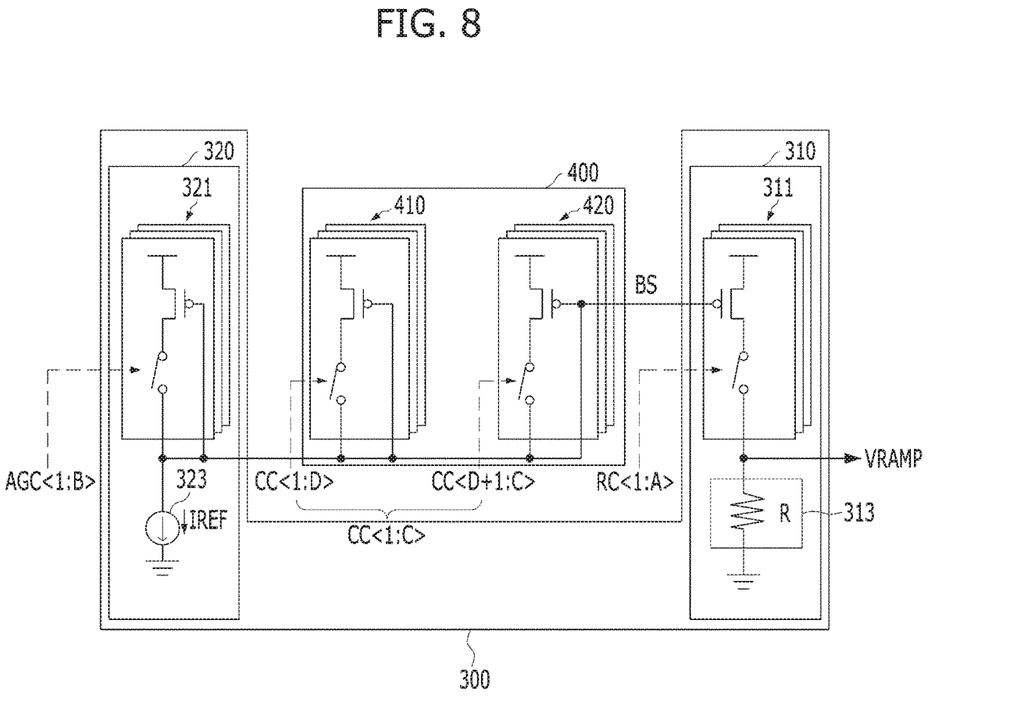
FIG. 8 is a diagram illustrating a ramp signal generation circuit and a slope correction circuit illustrated in FIG. 7.

FIG. 8 illustrates a diagram illustrating an exemplary configuration of the ramp signal generation circuit 300 and the slope correction circuit 400 illustrated in FIG. 7.

Referring to FIG. 8, the ramp signal generation circuit 300 may include a ramp signal generation block 310 and a bias signal generation block 320.

The ramp signal generation block 310 may generate the ramp signal VRAMP which is ramped in a prescribed range, on the basis of the ramp code signal RC<1:A>, and may adjust the slope of the ramp signal VRAMP on the basis of a bias signal BS. For example, the ramp signal generation block 310 may include a ramp current generation unit 311 and a fixed resistor unit 313.

The ramp current generation unit 311 may supply a ramp current, which is adjusted by a prescribed unit current amount per unit time, to an output terminal of the ramp signal VRAMP, on the basis of the ramp code signal RC<1:A>, and may adjust the unit current amount on the basis of the bias signal BS. For example, the ramp current generation unit 311 may include a plurality of unit current generation sections electrically coupled between a power supply voltage terminal and the output terminal. The plurality of unit current generation sections may adjust the unit current amount on the basis of the bias signal BS, and may sequentially supply a unit current to the output terminal on the basis of first to $A^{th}$ ramp control signals included in the ramp code signal RC<1:A>.

The fixed resistor unit 313 may convert the ramp current into the ramp signal VRAMP. For example, the fixed resistor unit 313 may be electrically coupled between the output terminal and a ground voltage terminal, and may have a fixed resistance value.

The bias signal generation block 320 may generate the bias signal BS having a second voltage level higher than a first voltage level by a first level corresponding to an analog gain, on the basis of a gain code signal AGC<1:B>. For example, the bias signal generation block 320 may include a plurality of bias current generation units 321 which may be selected by corresponding switches which are driven by the gain code signal AGC<1:B>, and a current source 323.

The plurality of bias current generation units 321 may be electrically coupled in parallel to one another between the power supply voltage terminal and an output terminal of the bias signal BS. At least one of the plurality of bias current generation units 321 may be selected on the basis of first to $B^{th}$ gain control signals included in the gain code signal AGC<1:B>. The plurality of bias current generation units 321 may supply a bias current corresponding to the second voltage level to the output terminal of the bias signal BS.

The current source 323 may be electrically coupled between the output terminal of the bias signal BS and the ground voltage terminal. The current source 323 may generate a reference current IREF.

The slope correction circuit 400 may include a first bias signal correction block 410 and a second bias signal correction block 420.

The first bias signal correction block 410 may primarily lower a voltage level of the bias signal BS by the first level and may secondarily increase the voltage level of the bias signal BS in a range corresponding to the first level, on the basis of at least one (hereinafter, referred to as a "first correction code signal CC<1:D>" of first to $C^{th}$ correction control signals included in the correction code signal CC<1:C>. For example, the first bias signal correction block 410 may include at least one first correction current generation unit electrically coupled in parallel to one another between the power supply voltage terminal and the output terminal of the bias signal BS. The first correction current generation unit may selectively supply a first correction current corresponding to the first level to the output terminal of the bias signal BS on the basis of the first correction code signal CC<1:D>. For example, the first correction current generation unit may primarily supply the first correction current to the output terminal of the bias signal BS, and may secondarily supply the first correction current to the output terminal of the bias signal BS optionally.

The second bias signal correction block 420 may secondarily lower the voltage level of the bias signal BS by the second level on the basis of the remaining signal (hereinafter, referred to as a "second correction code signal CC<D+1:C>" of the first to $C^{th}$ correction control signals included in the correction code signal CC<1:C>. For example, the second bias signal correction block 420 may include at least one second correction current generation unit electrically coupled in parallel to one another between the power supply voltage terminal and the output terminal of the bias signal BS. The second correction current generation unit may selectively supply a second correction current corresponding to the second level to the output terminal of the bias signal BS on the basis of the second correction code signal CC<D+1:C>. For example, the second correction current generation unit may primarily supply the second correction current to the output terminal of the bias signal BS, and may secondarily supply the second correction current to the output terminal of the bias signal BS optionally.

Hereinafter, since the operation of the electronic device having the aforementioned configuration in accordance with the second embodiment can be derived or modified through the operation of the electronic device in accordance with the first embodiment, a description thereof is omitted.

In accordance with the embodiments as described above, it is possible to correct the non-linearity of an analog gain occurring due to the process variation of a circuit directly or indirectly participating in generating a ramp signal.

Although various embodiments have been described for illustrative purposes, it will be apparent to those skilled in the art that various changes and modifications may be made without departing from the spirit and scope of the invention as defined in the following claims.

What is claimed is:

1. An electronic device comprising:
a ramp signal generation circuit configured to generate a ramp signal having a second slope that is decreased by a first level from a first slope which corresponds to an analog gain; and
a slope correction circuit configured to basically increase the second slope of the ramp signal by the first level and optionally increase or decrease a slope of the ramp signal by a second level to obtain the first slope,
wherein the slope correction circuit includes at least one second resistor part electrically coupled in parallel to an output terminal of the ramp signal, and
the second resistor part reflects a second resistance value corresponding to the second level in the output terminal on the basis of a second correction code signal.

2. The electronic device of claim 1, wherein the slope correction circuit corrects the slope of the ramp signal by controlling a resistance value which is reflected in the output terminal of the ramp signal.

3. The electronic device of claim 1, wherein the ramp signal generation circuit adjusts the slope of the ramp signal by controlling a resistance value which is reflected in the output terminal of the ramp signal.

4. The electronic device of claim 1, wherein the slope correction circuit comprising:
 a first slope correction block configured to basically increase the slope of the ramp signal by the first level and optionally decrease the slope of the ramp signal in a range corresponding to the first level, on a basis of a first correction code signal; and
 a second slope correction block configured to optionally increase the slope of the ramp signal by a second level on a basis of the second correction code signal.

5. The electronic device of claim 4, wherein the first slope correction block includes at least one first resistor part electrically coupled in parallel to the output terminal of the ramp signal, and
 the first resistor part selectively reflects a first resistance value corresponding to the first level in the output terminal on the basis of the first correction code signal.

6. The electronic device of claim 5, wherein the first resistor part basically reflects the first resistance value in the output terminal and secondarily reflects the first resistance value in the output terminal optionally.

7. The electronic device of claim 4, wherein the second slope correction block includes the second resistor part.

8. The electronic device of claim 1, wherein the second resistor part basically reflects the second resistance value in the output terminal and secondarily reflects the second resistance value in the output terminal optionally.

9. The electronic device of claim 1, wherein the ramp signal generation circuit comprising:
 a ramp signal generation block configured to generate the ramp signal on a basis of a ramp code signal; and
 a slope adjustment block configured to adjust the slope of the ramp signal so that the ramp signal has the second slope decreased by the first level from the first slope corresponding to the analog gain, on a basis of a gain code signal, the second slope corresponding to decreasing the first slope by the first level.

10. The electronic device of claim 9, wherein the slope adjustment block includes a plurality of third resistor parts electrically coupled in parallel to the output terminal of the ramp signal, and
 the plurality of third resistor parts reflect a third resistance value corresponding to the second slope in the output terminal on the basis of the gain code signal.

11. The electronic device of claim 9, wherein the ramp signal generation block comprises:
 a bias signal generation unit configured to generate a bias signal having a fixed voltage level corresponding to a reference current; and
 a ramp current generation unit configured to supply a ramp current, which is adjusted by a prescribed level per unit time, to the output terminal of the ramp signal on a basis of the bias signal and the ramp code signal.

12. A method for driving an electronic device comprising:
 intentionally generating a ramp signal having a second slope increased or decreased more than a first slope corresponding to an analog gain;
 basically correcting the ramp signal to have the first slope by enabling at least one of first resistor parts electrically coupled in parallel to an output terminal of the ramp signal; and
 optionally correcting the ramp signal to have the first slope when the ramp signal has a third slope increased or decreased more than the first slope by disabling the at least one of first resistor parts or enabling at least one of second resistor parts electrically coupled in parallel to the output terminal of the ramp signal.

13. The method of claim 12, wherein the ramp signal has the third slope due to a process variation of a circuit participating in generating the ramp signal.

* * * * *